MINIATURE ELECTROMECHANICAL FILTER WITH MAGNETIC DRIVE

Filed Aug. 11, 1967

Inventors:
William E. Engeler;
Marvin Garfinkel,
by Marvin Snyder
Their Attorney.

United States Patent Office 3,517,349
Patented June 23, 1970

3,517,349
MINIATURE ELECTROMECHANICAL FILTER WITH MAGNETIC DRIVE

William E. Engeler, Scotia, and Marvin Garfinkel, Schenectady, N.Y., assignors to General Electric Company, a corporation of New York Filed Aug. 11, 1967, Ser. No. 660,076
Int. Cl. H03h 9/00
U.S. Cl. 333—72 14 Claims

ABSTRACT OF THE DISCLOSURE

A miniature discrete electromechanical filter comprises a semiconductor resonator beam which is alloy bonded at either end to the sides of a cavity formed in a semiconductor wafer or ceramic base. The beam is situated in a magnetic field and is driven in its flexural mode by current through a metallic layer deposited on an insulating layer overlying the beam. Output signals are derived from piezoresistive regions diffused into the semiconductor beam.

BACKGROUND OF THE INVENTION

This invention relates to filters, and more particularly to discrete, miniature, magnetically driven electromechanical filters and methods of fabricating such filters.

Electromechanical filters or resonators have generally been made of crystalline quartz cut so as to mechanically resonate when electrically driven at a mechanical resonance frequency. Although the figure of merit commonly designated Q, which represents a number proportional to the ratio of average energy stored to energy dissipated per cycle, is quite high for such resonators, they possess the disadvantages of being expensive, due to the high cost of crystalline quartz and its poor machinability. Devices of this type are also quite large and require special mounting. Moreover, the output of a quartz resonator or that of any other piezoelectric device loads the input.

More recently, two other types of electromechanical filters have appeared. One type comprises a small metal flexor mounted on top of a silicon wafer and positioned above the gate region of a field effect transistor so as to act as the gate electrode. The flexor beam is capacitively driven from the substrate, and its motion modulates a voltage at the gate of the field effect transistor in order to modulate the field effect transistor output signal. However, this device suffers from the defect that the output signal is non-linear.

The second type of electromechanical filter which has recently appeared utilizes a flexing beam of silicon which is mounted on a substrate. The output of this device is piezoresistive, and is thus linear. The drive mechanism is thermal in that resistively generated heat expands appropriately chosen sections of the beam and, if the frequency is proper, the beam can be made to resonate. This second device is limited in operation to low frequencies.

In our copending application Ser. No. 660,078 filed concurrently herewith and assigned to the instant assignee, we describe and claim an electromechanical filter formed in monolithic silicon and compatible with integrated circuitry. The entire filter, including the resonator member, is formed of a single crystal semiconductor and may be fabricated on a common chip with associated integrated circuitry. In our copending application Ser. No. 660,077, also filed concurrently herewith and assigned to the instant assignee, we describe and claim an electromechanical filter formed either in monolithic silicon or as a discrete element, having a cantilevered resonator which is moved through a magnetic field, with a strain sensitive resistive element integrally included in a support region of the cantilever for sensing strain therein.

By use of the instant invention, a discrete electromechanical filter may be fabricated having a resonator beam which is magnetically driven in the flexural mode. Output transducer means comprising a strain sensitive resistive element are integrally included for sensing strain in the resonator member. Since the output signal is linear in resonator strain, there is no harmonic generation by the filter. The range of frequencies available by suitable choice of resonator geometry, mode of oscillation, and excited harmonic is very wide, ranging from $10^3$ Hz.–$10^9$ Hz. and thereby including both audio and video intermediate frequencies. Furthermore, the output circuitry is completely decoupled from the input and does not load the input circuitry at all; also, the output signal may be supplied at almost any impedance level desired. Because the output transducing means are integral with the oscillating member, all signal attenuation due to losses at resonator-transducer interfaces is eliminated.

The electromechanical filter of the instant invention is driven by an alternating current supplied to the mechanical resonator of the electromechanical filter in the presence of a magnetic field created either by a permanent magnet or by electromagnetic means. The alternating current furnished to the resonator does very little, unless the frequency of alternation falls within the pass band of the mechanical resonator. When the input frequency of the alternating current does fall within the resonator pass band, a mechanical oscillation of the resonator builds up, with amplitude dependent upon input power and upon Q of the resonator. The resonant member, which thereupon resonates, has pass band frequencies determined by its geometrical shape and the elastic properties of the material of which it is comprised.

The electrical output signal may be obtained from a piezoresistive region or resistor diffused into a surface of the resonator in the manner described in our aforementioned copending application Ser. No. 660,078. Placement of the diffused resistor is selected to maximize the output signal so that, as the resonator oscillates, resistance of the diffused resistor changes, producing an electrical output signal proportional to amplitude of strain in the resistor. Since strain in the diffused resistor thus varies sinusoidally with time, an AC output signal is obtained. This signal may be maximized by situating the resistor at locations where maximum strain occurs and by selecting proper orientation of the resistor with respect to the crystallographic axes of the semiconductor. For uniaxial strain in simple flexural resonators comprised of silicon, the longitudinal axis of both the diffused resistor and the resonator should be along a $\langle 111 \rangle$ direction in the case of a P-type output resistor and along a $\langle 100 \rangle$ direction for an N-type resistor, resulting in gauge factors for low concentrations of impurities of approximately 180 and 130 respectively. For more complex resonator configurations, the direction of maximum uniaxial strain and the diffused resistor should both be a $\langle 111 \rangle$ direction in the case of a P-type output resistor and a $\langle 100 \rangle$ direction in the case of an N-type output resistor. "Gauge factor," as used herein, may be defined as the ratio of the net fractional change in resistivity of the diffused resistor utilized as a sensor, caused by uniform strain in the flexor member, to the uniform strain of the flexor member.

BRIEF SUMMARY OF THE INVENTION

Briefly, in accordance with a preferred embodiment of the invention, a discrete electromechanical filter is provided. This filter comprises a rigid walled structure defining a cavity therein, with semiconductor resonator means bonded to the upper surfaces of the walls of the rigid walled structure. Current conducting means are adhered to the resonator means along the length of the resonator means with a magnetic field directed substantially normal to the direction of current flow in the plane of the resonator means. Piezoresistive output means integral with the resonator means and responsive to oscillation of the resonator means are provided for producing a signal of amplitude and frequency proportional respectively to the amplitude and frequency of oscillation of the resonator means.

Accordingly, one object of the invention is to provide a discrete electromechanical filter having an output signal which is linear in resonator strain so as to avoid harmonic generation by the filter.

Another object is to provide a discrete electromechanical filter where in the output circuitry does not load the input circuitry.

Another object is to provide a magnetically driven discrete electromechanical filter having a frequency range and an output impedance level selectable from a wide range of values.

Another object is to provide a discrete electromechanical filter having a semiconductor resonator which may be bonded to a rigid base and driven in a flexural mode.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF THE PREFERRED EMBODIMENTS

Figure 1:
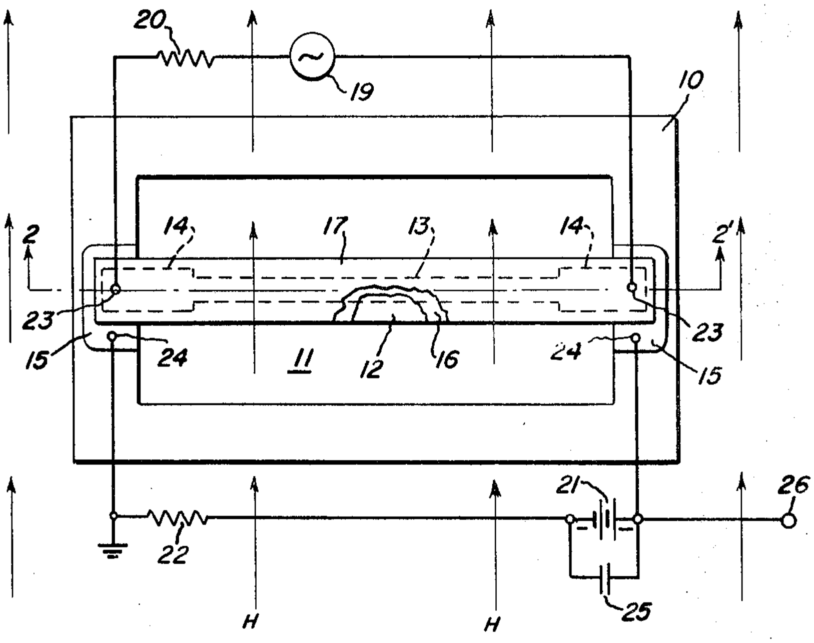
FIG. 1 is a plan view of the discrete electromechanical filter of the invention, showing both input and output circuitry therefor.

In FIG. 1, a rigid base 10, comprised of a monocrystalline or polycrystalline semiconductor wafer, or a ceramic, is illustrated with a cavity 11 therein. For illustrative purposes, the material of base 10 is herein assumed to be a ceramic, such as aluminum oxide or a mixture of aluminum oxide and silicon dioxide, commonly known as mullite, whose thermal expansion is similar to that of silicon over the temperature range employed in fabrication of the filter. Mullite may be purchased from McDanel Refractory Porcelain Company, Beaver Falls, Pa, A semiconductor beam 12, typically silicon, is bonded at either end to the upper surfaces of the walls of base 10 through metallized regions 15. If beam 12 of P-type conductivity, as will be assumed herein for illustrative purposes, the beam is oriented with its length along a <100> crystallographic axis and an N-type resistor is therefore diffused along the same <100> axis in order to maximize the gauge factor; if the beam were of N-type conductivity however, the beam would be oriented with its length along a <111> crystallographic axis and a P-type resistor would be diffused along the same <111> axis for the same reasons. A piezoresistive strain sensing region 13 is diffused into the underside of beam 12, with widened areas 14 at either end thereof in order to avoid registering strains which change resistance of the piezoresistive region in a direction opposite to that which occurs in the region of maximum strain to be measured. Alternatively, regions 14 may be of the same width as that of region 13, but of deeper diffusion depth. A layer 16 of insulation, such as silicon dioxide, is formed on the upper surface of silicon beam 12, and a metallic conductor 17, such as molybdenum or aluminum, is deposited in a layer on insulating layer 16.

Figures 2, 2A, 3:
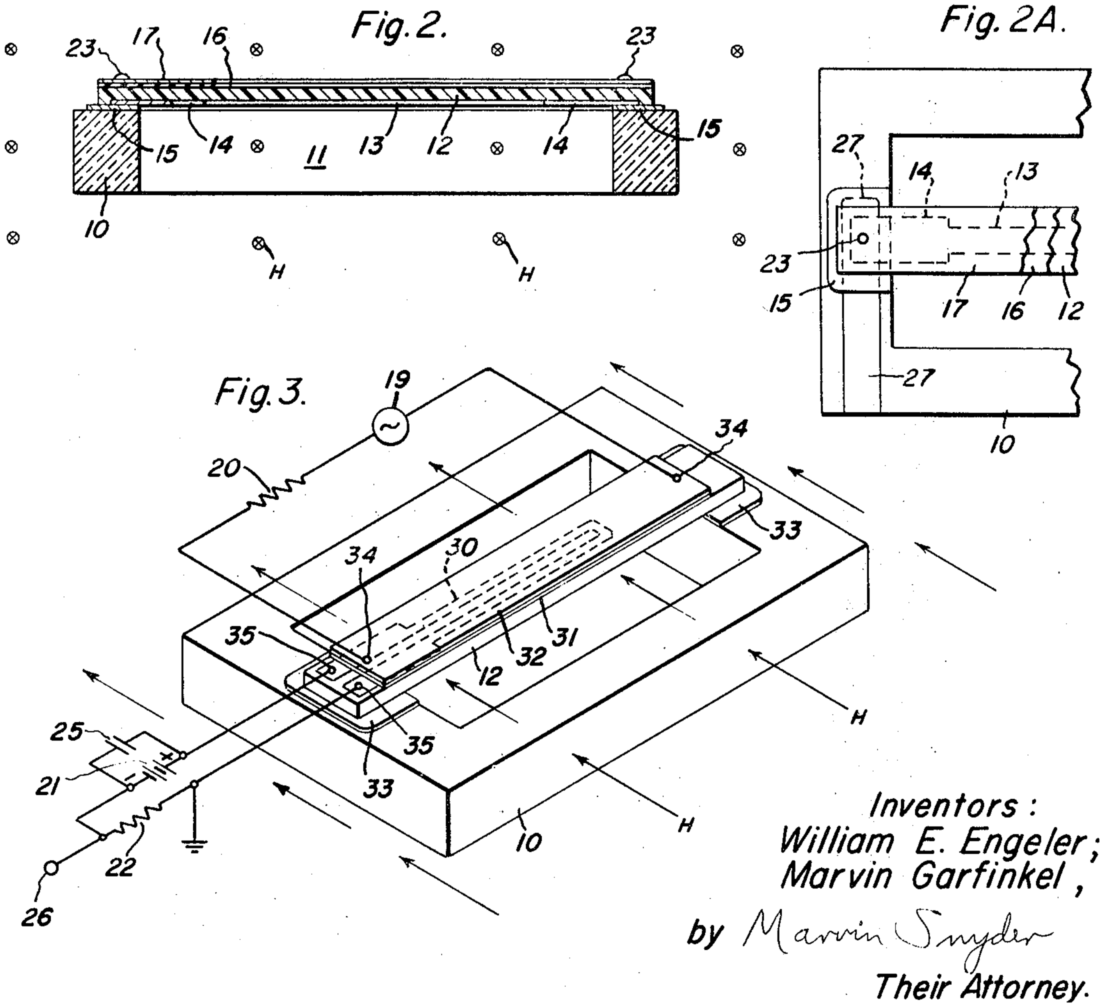
FIG. 2 is a cross-sectional view of the electromechanical filter of FIG. 1 as viewed along line 2—2′ of FIG. 1.
FIG. 2A is a plan view of a portion of the discrete electromechanical filter of the invention, illustrating an alternative type of connection to the resonator thereof.
FIG. 3 is an isometric view of another embodiment of the invention, showing input and output circuitry therefor.

An input signal source 19 is connected in series with a current limiting resistance 20 through thermocompression bonds 23 for example, to metallic layer 17 at either end of beam 12. In addition, a DC supply 21 is connected in series with a current limiting resistance 22 across diffused regions 13 and 14 through thermocompression bonds 24 for example, to metallized regions 15. Preferably, gold leads are utilized so as to facilitate adequate thermocompression bonds. Output signals are measured at an output terminal 26 across resistance 22. A capacitance 25 is connected in shunt with bias source 21 in order to provide an AC bypass path for output singals from the piezoresistive diffused regions. The entire device is situated in a magnetic field, H, created either by a permanent magnet or electromagnetic means directed perpendicular to beam 12 in the plane of the device, as indicated by the arrows in FIG. 1. This magnetic field, H, is further indicated in FIG. 2 as being directed into the plane of the paper by virtue of the symbols ⊗, since FIG. 2 represents a cross-sectional view of FIG. 1 taken along line 2–2′ of FIG. 1, with like numbers indicating like elements.

By virtue of the interaction of oscillatory current though metallic layer 17 with the magnetic field directed therethrough, which is assumed to be of constant intensity, an oscillatory force normal to both the current flow and magnetic field is exerted by metallic layer 17 on beam 12, causing the beam to oscillate at a frequency determined by the frequency of input signal source 19. Although the amplitude of oscillation of beam 12 is quite small if the frequency of input signal source 19 does not coincide with a resonant frequency of beam 12, the amplitude of oscillation of the beam increases greatly when the input signal frequency corresponds to a resonant frequency of the beam. Under such conditions, the beam resonates in its flexural mode. In this mode of oscillation at the fundamental frequency, the strain at the center of the beam is maximum, with nodes appearing at locations approximately 20% along the length of the beam measured inward from its innermost point of support at either end thereof. Within the demarcated approximate 20% lengths of the bar, the strain within the diffused piezoresistive region of the bar is of reverse polarity or sign to that of the piezoresistive region closer to the center of the bar. The desirable result of being able to measure only the strain in one direction and ignore the strain in the opposite direction is thus accomplished by the widened regions of the piezoresistive region, since the widened regions have considerably lower resistance than the innermost regions thereof which are narrower. Hence, a change in resistance in the widened piezoresistive regions is of little import to the amplitude of the output signal which is primarily determined by resistance in the narrower piezoresistive regions.

Beam 12 is fabricated from a monocrystalline semiconductor wafer, such as silicon, of the desired conductivity type, assumed herein to be P-type. The piezoresistive region in the lower surface of the beam may comprise a variable depth diffusion such that the resistance is developed essentially in the regions of the bar having strain of one sign. This may be accomplished by thermally oxidizing the wafer, using photoengraving techniques to pattern the oxide thus formed, and thereafter diffusing impurities therein so as to form an opposite conductivity type piezoresistive region along a <100> crystallographic axis as described, supra. Where some silicon dioxide remains, the diffusion will be inhibited; in other regions, much deeper diffusion results. This produces a resistor with varying resistivity along its length. On the other hand, it is also feasible to diffuse to a constant depth along the entire length of the bar, but with widened regions where the resistance is to be of considerably lower value. In either event, conduction of the diffused region is restricted across the central region of the bar, and thus the signal developed across the bar will be derived primarily from the central region.

The silicon beam or bar may next be cut from the P-type wafer by ultrasonic cutting, or may be removed by chemical etching, so that orientation of the bar is along the <100> crystallographic direction. For an N-type wafer, however, the bar would be cut along a <111> crystallographic axis. Although for illustrative purposes it is assumed that the resonator means comprises a simple beam, it is clear that the aforementioned techniques can produce a plurality of other desired resonant shapes. After the beam has been cut, the edges of the silicon are preferably etched to remove mechanical damage caused by the cutting process. Insulating layer 16, which may conveniently comprise silicon dioxide, is next formed onto the silicon beam by thermal oxidation or pyrolytic decomposition for example, and metallic conductor 17 is applied over layer 16 by either sputtering or evaporation. Beam 12 is next attached to rigid base 10, which forms a support for the beam and permits both electrical and mechanical contact to be made to the beam.

Bar 12 is attached to ceramic base 10, which is preferably comprised of a ceramic such as mullite or aluminum oxide, by first coating molybdenum trioxide onto the ceramic of base 10 in the desired regions by conventional silk screening and thereafter heating base 10 in a hydrogen atmosphere to 1300° C. Next, silver containing approximately 10% tin is melted at 810° C. so as to alloy to the fired molybdenum trioxide. In order to make ohmic contact to the N-type piezoresistive diffused strain sensing region, the silver-tin metallizing material contains small amounts of an N-type dopant such as phosphorous, arsenic or antimony for example. On the other hand, if the silicon bar were of N-type conductivity, and the piezoresistive diffused region were of P-type conductivity, the silver-tin metallizing material would include a small amount of P-type dopant such as indium, aluminum or gallium for example, in order to ensure ohmic contact to the P-type diffused region. The composite structure of beam 12 is positioned so as to bridge cavity 11 and is likewise alloyed with the same silver-tin metallizing material including the same conductivity-type determining impurities, here assumed to be antimony, by heating the material on the bar in a hydrogen atmosphere above the eutectic temperature to about 750° C. in order to provide an ohmic contact to the N-type material of the diffused piezo resistive region, while also providing an isolating P-N junction wherever the metallizing alloy penetrates to the P-type regions of the bar. Gold leads are then thermocompression bonded to the silver-tin metallic conductor 15 and to either end of metallic layer 17.

Although the aforementioned process is described for base 10 being a ceramic, the base, as previously mentioned, might also be a semiconductor, such as silicon. In such case, the process for bonding beam 12 to base 10 is identical to that described for the ceramic base, except that molybdenum trioxide is not applied at all, and the step of melting the silver-tin alloy at 810° C. so as to alloy to the molybdenum trioxide is also omitted. Attachment of leads may also be performed as described for the ceramic base or, in the alternative, may be diffused into the upper surfaces of the opposite walls of base 10 beneath beam 12 so as to make ohmic contact with the beam through the silver-tin metallizing material. This is illustrated in the embodiment of FIG. 2A which represents but a portion of the filter fabricated in this manner, wherein like numbers indicate like elements. Each low resistivity diffused region 27 on the upper surfaces of the walls of base 10 then serves as a lead to other portions of output circuitry such as illustrated in FIG. 1. In the embodiment of FIG. 2A the conductivity type of the diffused regions in beam 12 and structure 10 are identical and, if they are N-type as assumed here, metallized region 15 contains a small amount of antimony to ensure ohmic contact. Similarly, if the diffused regions were P-type, metallized region 15 would contain a small amount of gallium for example.

FIG. 3 represents another embodiment of the invention in which both a U-shaped piezoresistive diffused region 30 and metallic layer 32 are deposited over the upper surface of beam 12. Metallic layer 32 is separated from the silicon of beam 12 by an insulating layer such as silicon dioxide 31. Beam 12 is bonded to the upper surfaces of the walls of base 10 with the aforementioned silver-tin alloy. In this alloy, however, which is illustrated as regions 33, no N-type or P-type dopants need be contained therein, since no ohmic contact is made through this alloy to N-type or P-type materials; that is, the alloy merely serves as a mechanical bond in this embodiment. Input contacts 34 to metallic layer 32 and output contacts 35 from piezoresistive diffused region 30 are all preferably conventional thermocompression bonds with gold leads connected thereto. The energizing circuitry and output circuitry are identical to the circuitry illustrated in FIG. 1, and a magnetic field is directed in the plane of the device perpendicular to beam 12 in the manner described and illustrated in the embodiment of FIG. 1. Operation of the device of FIG. 3 is identical to operation of the device of FIGS. 1 and 2 as described supra. However, because the piezoresistive region is also situated within the magnetic field coupling metallic layer 32, the piezoresistive region may be made bifilar or U-shaped so as to cancel out any induced voltage therein due to motion of this region within the magnetic field. Hence, output voltage at terminal 26 is a function of strain only. Preferably, U-shaped region 30 extends over about one-half to four-fifths the length of beam 12.

The foregoing describes a discrete electromechanical filter having an output signal which is linear in resonator strain so as to avoid harmonic generation by the filter. The output circuitry does not load the input circuitry and the output impedance level is selectable from a wide range of values. The filter, which is shown as being magnetically driven, has a semiconductor resonator which may be bonded to a rigid base and driven in a flexural mode. It should be noted however that the filter may, if desired, be driven according to the other driving techniques described and claimed in our aforementioned copending application Ser. No. 660,078.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. A discrete electromechanical filter comprising: a rigid walled structure defining a cavity therein, the plane of said structure being situated in a magnetic field of substantially constant strength; semiconductor resonator means bonded to the upper surface of the walls of said rigid walled structure so as to bridge said cavity; insulator means adherent to said resonator means along the length thereof; current conducting means adherent to said insulator means along the length thereof, said current conducting means being situated substantially normal to the direction of said magnetic field; and piezoresistive output means integral with said resonator means and responsive to oscillation of said resonator means for producing a signal of amplitude and frequency proportional respectively to the amplitude and frequency of oscillation of said resonator means.

2. The electromechanical filter of claim 1 wherein said insulator means are adherent to one surface of said semiconductor resonator means and said piezoresistive output means include a region diffused in said one surface of said semiconductor resonator means, the conductivity type of said semiconductor resonator means and said diffused region being opposite to each other.

3. The electromechanical filter of claim 1 wherein said insulator means are adherent to one surface of said semiconductor resonator means and said piezoresistive output means include a region diffused into a surface opposite said one surface of said semiconductor resonator means, the conductivity type of said semiconductor resonator means and said diffused region being opposite to each other.

4. The electromechanical filter of claim 3 wherein said semiconductor resonator means are bonded to the upper surfaces of said rigid walled structure through an alloy including silver, tin and one of the group consisting of P-type dopants and N-type dopants, antimony and gallium.

5. The electromechanical filter of claim 1 wherein said semiconductor resonator means comprise silicon, said insulator means comprise an oxide of silicon and said current conducting means comprise a metallic layer.

6. The electromechanical filter of claim 1 wherein said rigid walled structure comprises a semiconductor material and said semiconductor resonator means comprise said semiconductor material.

7. The electromechanical filter of claim 6 wherein said semiconductor material comprises silicon.

8. The electromechanical filter of claim 7 wherein the silicon of said resonator means is bonded to the upper surfaces of the silicon of said rigid walled structure through an alloy comprising silver and tin.

9. The electromechanical filter of claim 7 wherein the silicon of said resonator means is bonded to the upper surfaces of the silicon of said rigid walled structure through an alloy including one of the group consisting of P-type dopants and N-type dopants, the silicon of said walled structure including low resistivity regions diffused into the upper surfaces of the walls of said structure to make electrical contact with regions of said resonator means.

10. The electromechanical filter of claim 1 wherein said rigid walled structure comprises a ceramic material.

11. The electromechanical filter of claim 10 wherein the material of said semiconductor resonator means comprises silicon and said ceramic material comprises one of the group consisting of aluminum oxide and mullite.

12. The electromechanical filter of claim 11 wherein the silicon of said resonator means is bonded to the ceramic material of said base through an alloy comprising molybdenum trioxide, silver and tin.

13. The electromechanical filter of claim 1 wherein said semiconductor resonator means are bonded to the upper surfaces of said rigid walled structure through an alloy including silver and tin.

14. The electromechanical filter of claim 2 wherein said piezoresistive output means are of bifilar configuration so as to essentially cancel out all induced voltages therein due to motion in a direction substantially perpendicular to the direction of said magnetic field.

References Cited

UNITED STATES PATENTS

| | | | |
|---|---|---|---|
| 3,200,354 | 8/1965 | White | 333—30 |
| 3,295,064 | 12/1966 | White | 328—58 |
| 3,283,271 | 11/1966 | Persson | 333—71 |
| 3,277,405 | 10/1966 | Persson | 333—71 |
| 3,413,573 | 11/1968 | Nathanson et al. | 332—31 |
| 2,553,491 | 5/1951 | Shockley | 171—330 |

HERMAN KARL SAALBACH, Primary Examiner

C. BARAFF, Assistant Examiner

U.S. Cl. X.R.

317—235; 332—31